United States Patent
Lin et al.

(10) Patent No.: US 10,163,897 B2
(45) Date of Patent: Dec. 25, 2018

(54) INTER-LEVEL CONNECTION FOR MULTI-LAYER STRUCTURES

(71) Applicant: Taiwan Semiconductor Manufacturing Co., Ltd., Hsinchu (TW)

(72) Inventors: Yi-Tang Lin, Hsinchu (TW); Clement Hsingjen Wann, New York, NY (US); Neng-Kuo Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 186 days.

(21) Appl. No.: 14/080,940

(22) Filed: Nov. 15, 2013

(65) Prior Publication Data

US 2015/0137249 A1    May 21, 2015

(51) Int. Cl.
  *H01L 21/822*    (2006.01)
  *H01L 27/06*     (2006.01)
  (Continued)

(52) U.S. Cl.
  CPC ........ *H01L 27/0688* (2013.01); *H01L 23/522* (2013.01); *H01L 27/088* (2013.01); *H01L 2924/0002* (2013.01)

(58) Field of Classification Search
  CPC . H01L 23/522; H01L 27/0688; H01L 27/088; H01L 2224/9202; H01L 21/8221
  See application file for complete search history.

(56) References Cited

U.S. PATENT DOCUMENTS

| 8,546,250 B2 * | 10/2013 | Piper .................. H01L 27/0688 257/E21.614 |
| 2001/0005059 A1 * | 6/2001 | Koyanagi ........... H01L 21/8221 257/778 |

(Continued)

FOREIGN PATENT DOCUMENTS

| CN | 101345240 | 1/2009 |
| CN | 100508130 | 7/2009 |

(Continued)

OTHER PUBLICATIONS

Korean Office Action; Application No. 10-2014-0149296; dated Jun. 18, 2015.

(Continued)

*Primary Examiner* — Frederick B Hargrove
(74) *Attorney, Agent, or Firm* — McDermott Will & Emery LLP

(57) ABSTRACT

Systems and methods are provided for fabricating a semiconductor device structure. An example semiconductor device structure includes a first device layer, a second device layer and an inter-level connection structure. The first device layer includes a first conductive layer and a first dielectric layer formed on the first conductive layer, the first device layer being formed on a substrate. The second device layer includes a second conductive layer, the second device layer being formed on the first device layer. The inter-level connection structure includes one or more conductive materials and configured to electrically connect to the first conductive layer and the second conductive layer, the inter-level connection structure penetrating at least part of the first dielectric layer. The first conductive layer is configured to electrically connect to a first electrode structure of a first semiconductor device within the first device layer.

16 Claims, 16 Drawing Sheets

(51) Int. Cl.
*H01L 27/088* (2006.01)
*H01L 23/522* (2006.01)

(56) References Cited

U.S. PATENT DOCUMENTS

| | | |
|---|---|---|
| 2003/0129829 A1 | 7/2003 | Greenlaw |
| 2003/0146515 A1* | 8/2003 | Kajiyama ............... B82Y 10/00 257/758 |
| 2005/0275017 A1* | 12/2005 | Pozder ................ H01L 21/8221 257/347 |
| 2009/0002590 A1* | 1/2009 | Kimura ............... H01L 27/1214 349/43 |
| 2009/0014796 A1* | 1/2009 | Liaw ....................... H01L 27/11 257/347 |
| 2009/0023263 A1* | 1/2009 | Phan ....................... H01L 28/20 438/384 |
| 2009/0065941 A1* | 3/2009 | La Tulipe, Jr. ... H01L 21/76802 257/761 |
| 2011/0096215 A1 | 4/2011 | Choi et al. |
| 2011/0134683 A1* | 6/2011 | Yamazaki ............. G11C 11/405 365/149 |
| 2013/0043554 A1* | 2/2013 | Piper ................... H01L 27/0688 257/506 |
| 2013/0179853 A1 | 7/2013 | Bernstein et al. |
| 2014/0252306 A1* | 9/2014 | Du .......................... H01L 23/48 257/9 |

FOREIGN PATENT DOCUMENTS

| | | |
|---|---|---|
| JP | 04-116851 A | 4/1992 |
| JP | 2003-007849 A | 1/2003 |
| KR | 10-2010-0094905 A | 8/2010 |
| KR | 10-2011-0043867 A | 4/2011 |
| TW | 200924058 | 6/2009 |

OTHER PUBLICATIONS

Korean Office Action; Application No. 10-2016-0054069; dated Jun. 3, 2016.
Chinese Office Action; Application No. 201410431597.5; dated Feb. 4, 2017.
Korean Office Action issued in corresponding Korean Patent Application No. 10-2017-0078514, dated Sep. 16, 2017.
Korean Notice of Allowance issued in corresponding Korean Patent Application No. 10-2017-0078514, dated Nov. 30, 2017.

* cited by examiner

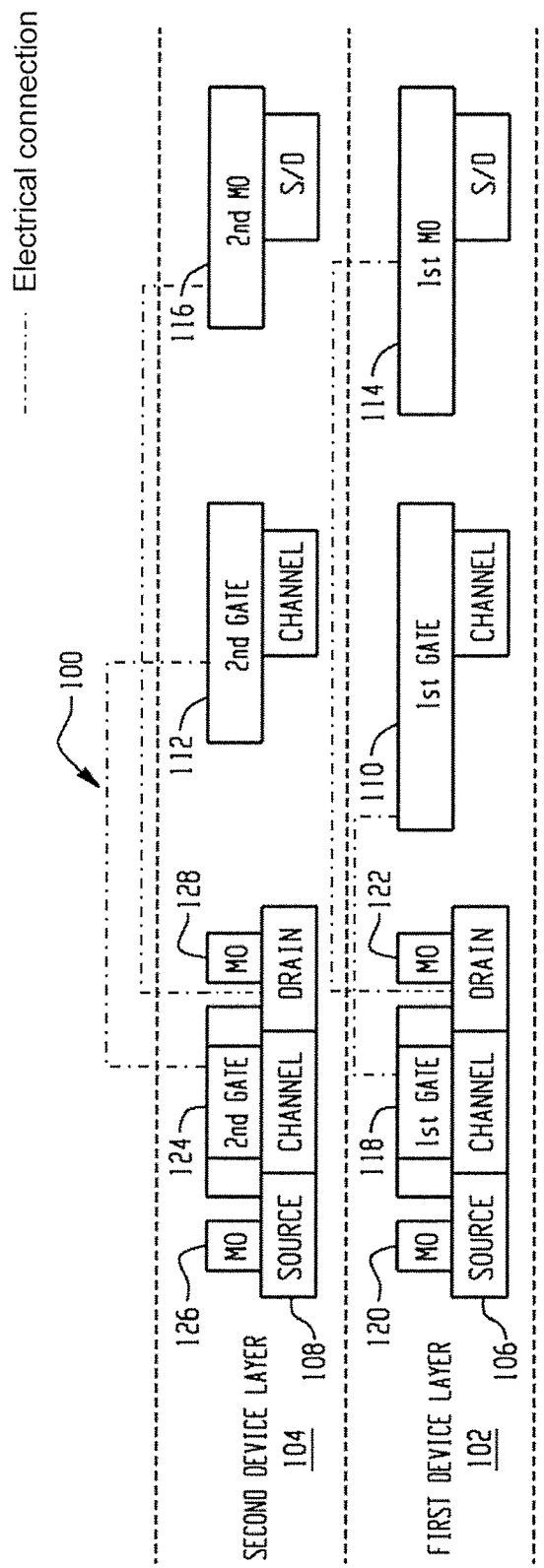

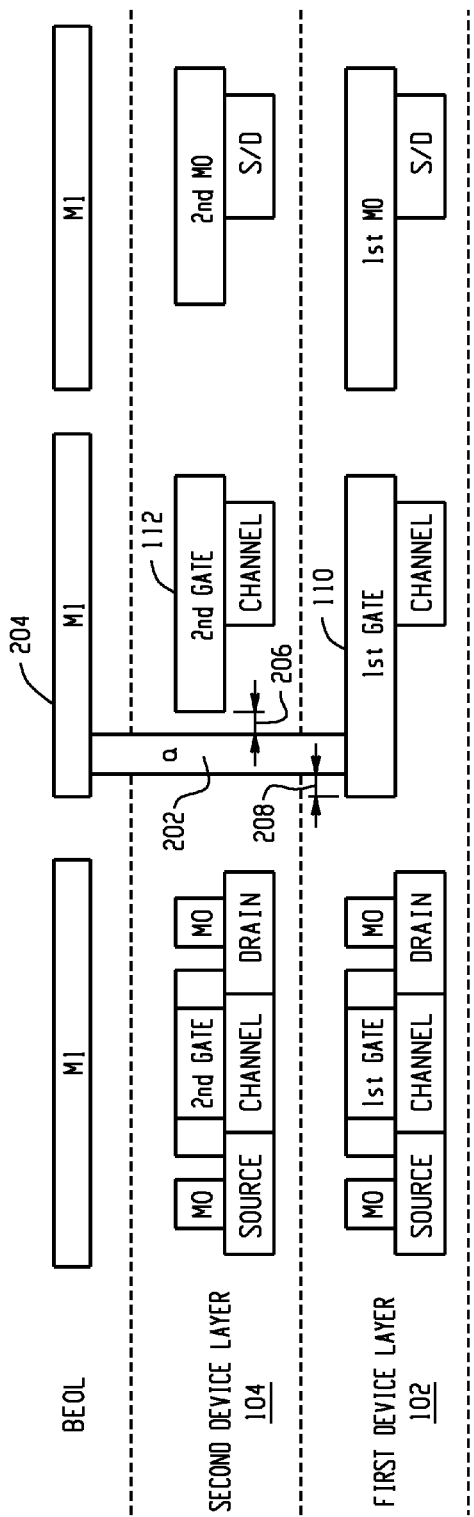
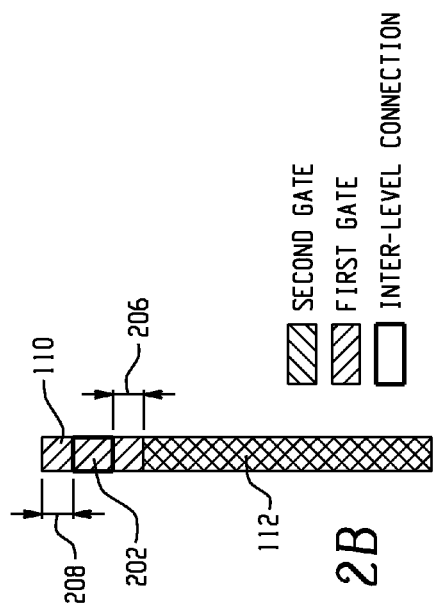
Fig. 2A
Fig. 2B

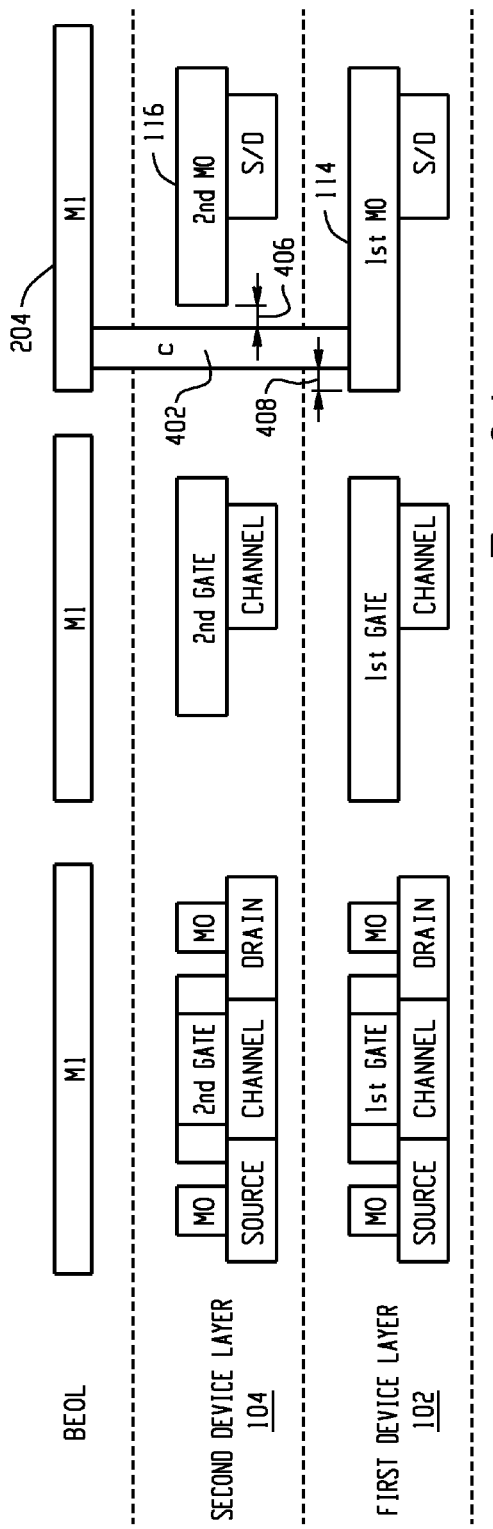
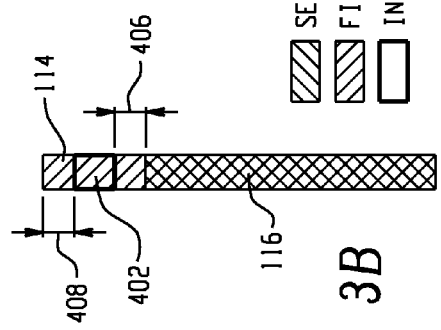
Fig. 3A
Fig. 3B

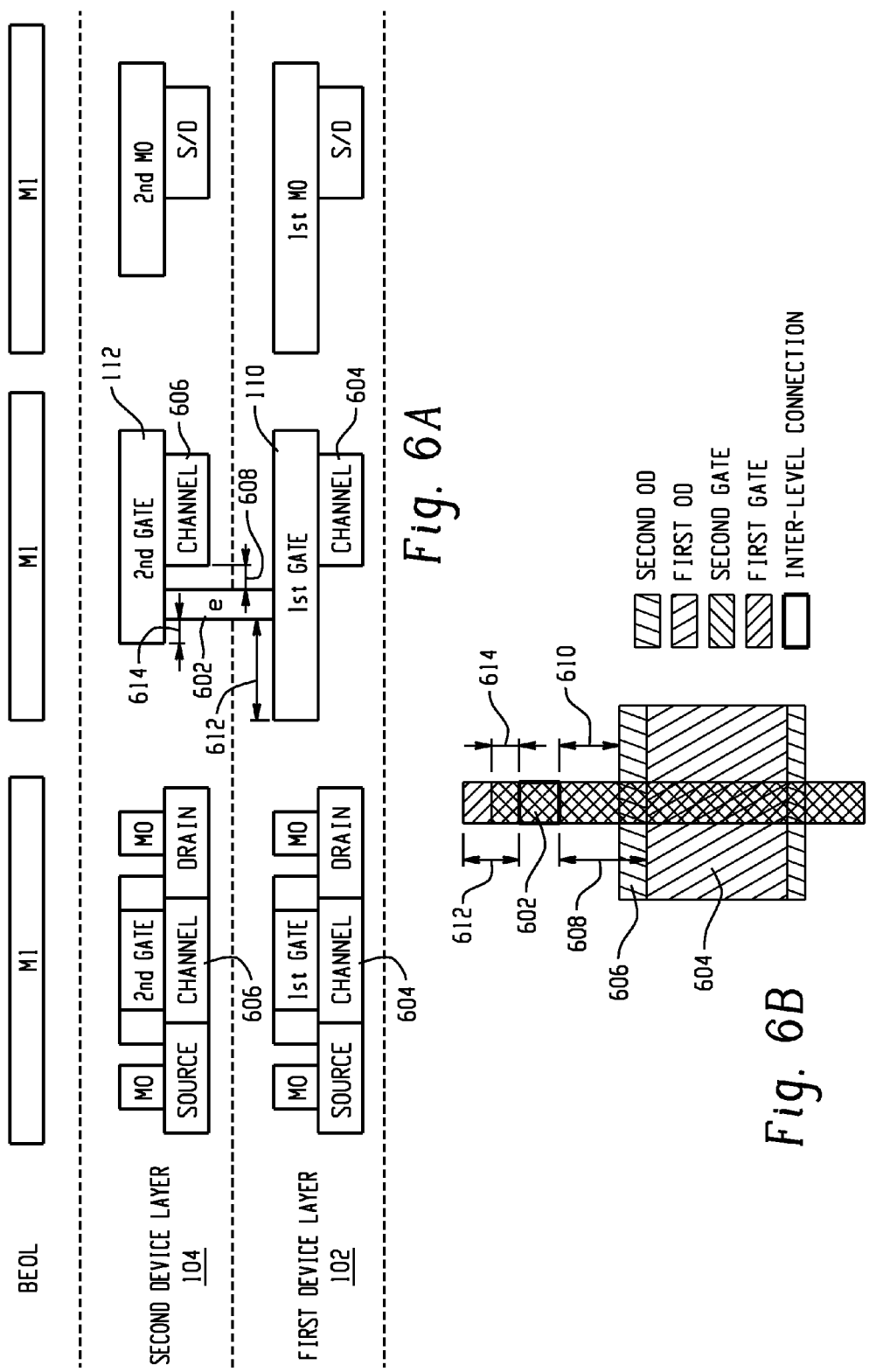

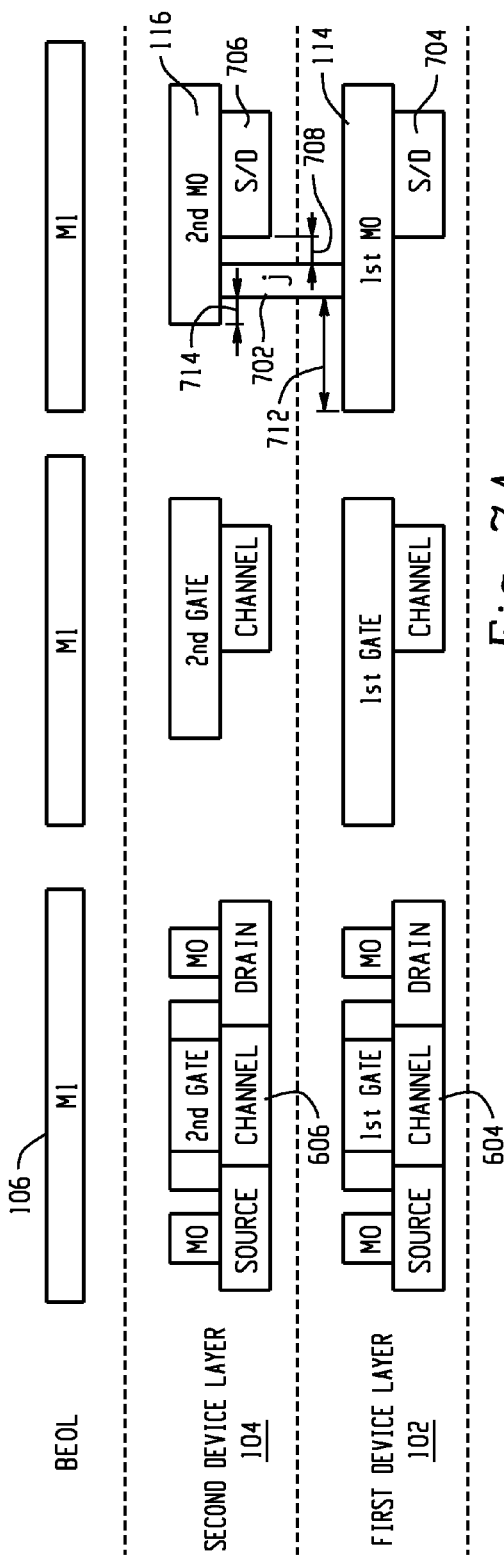
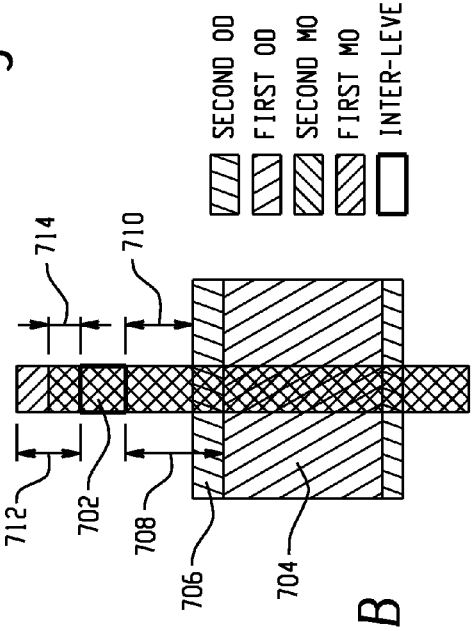
Fig. 7A
Fig. 7B

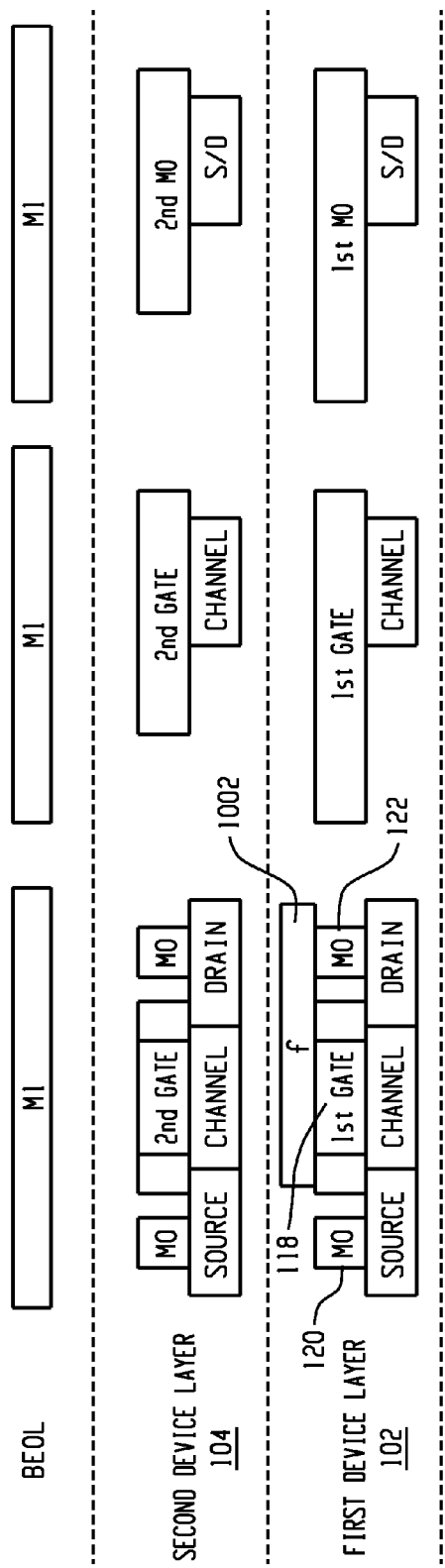
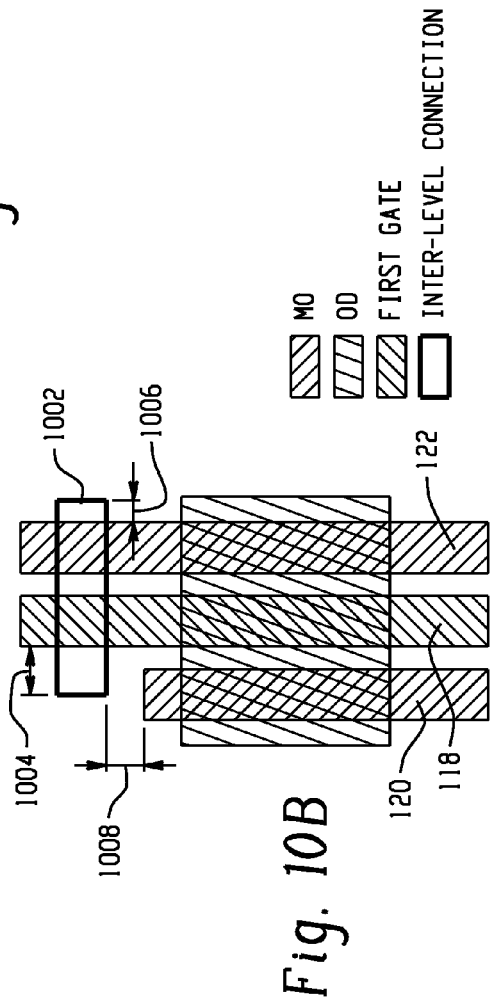
Fig. 10A
Fig. 10B

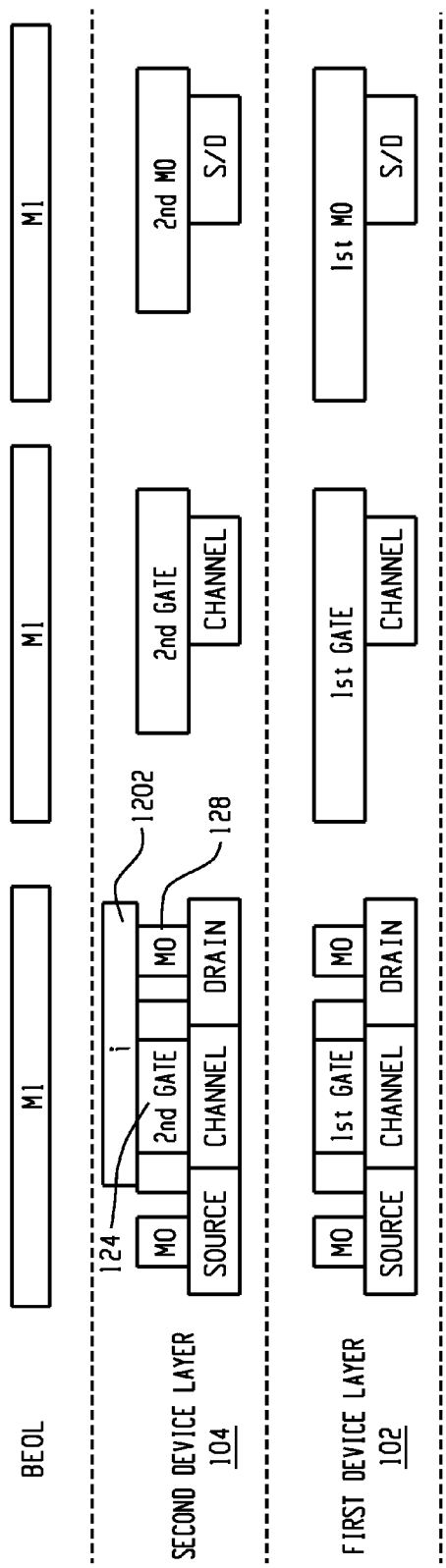
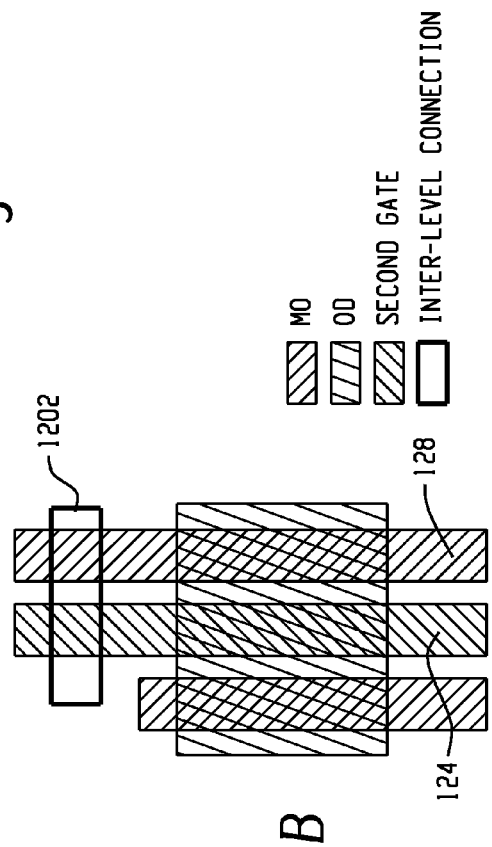
Fig. 11A
Fig. 11B

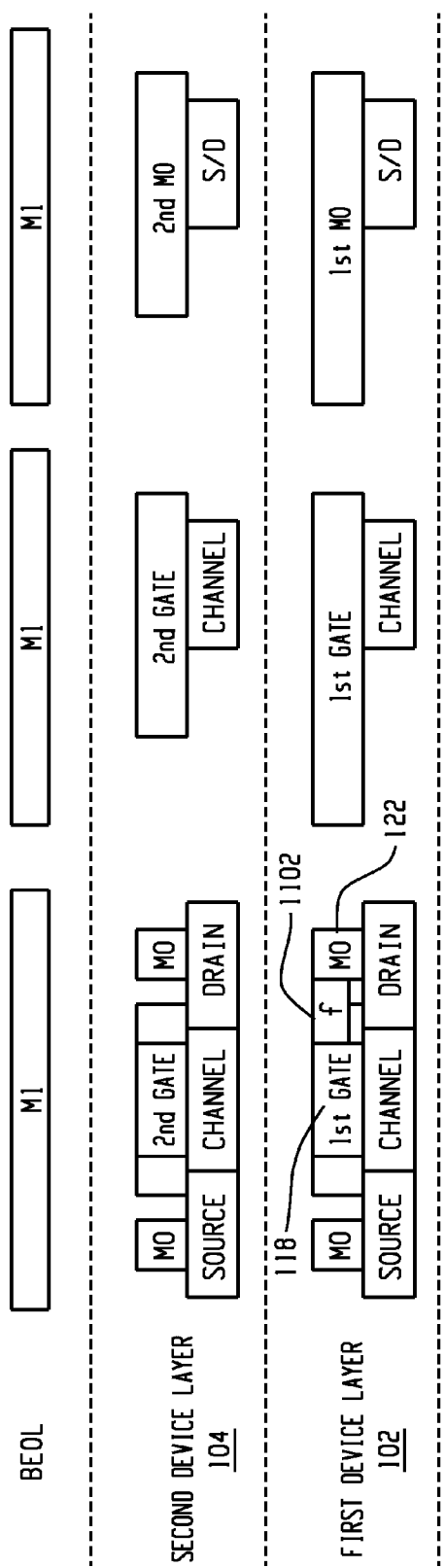
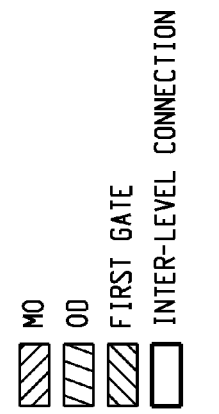
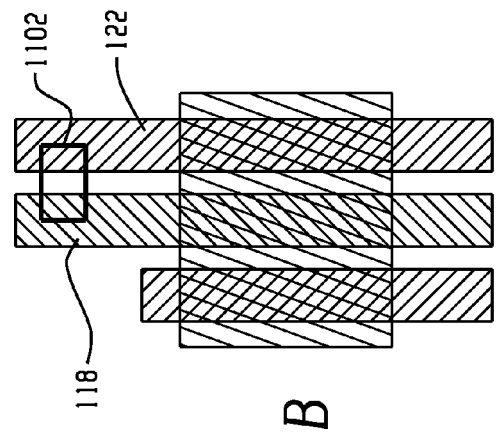
Fig. 12A
Fig. 12B

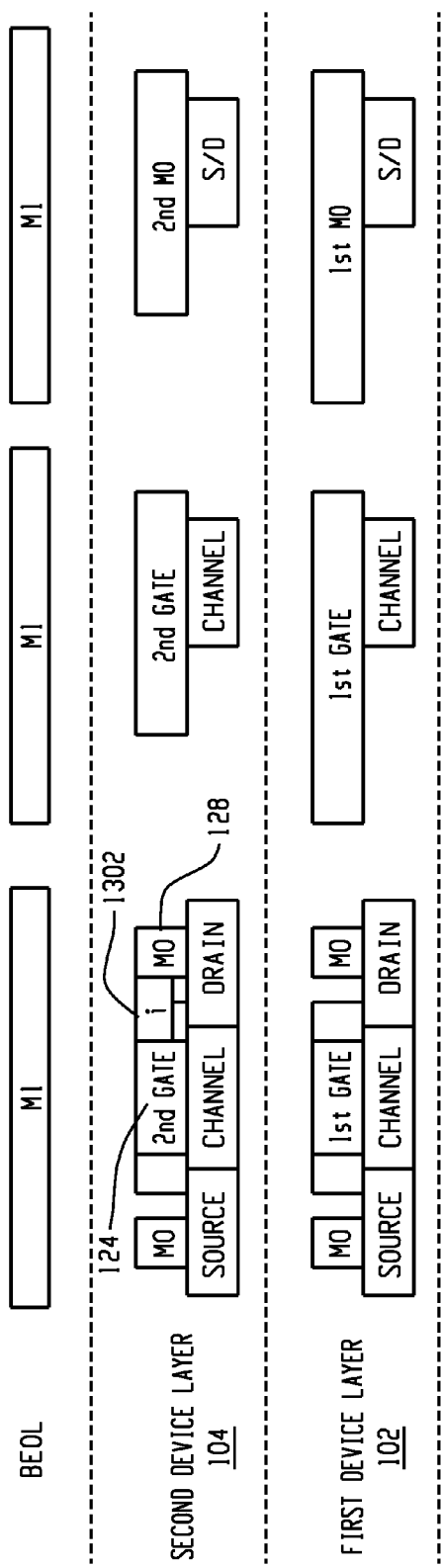
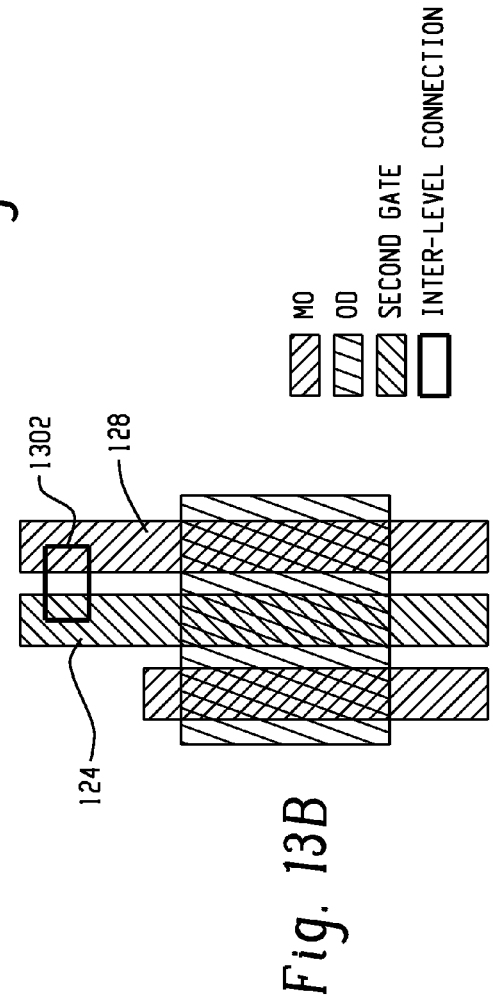
Fig. 13A
Fig. 13B

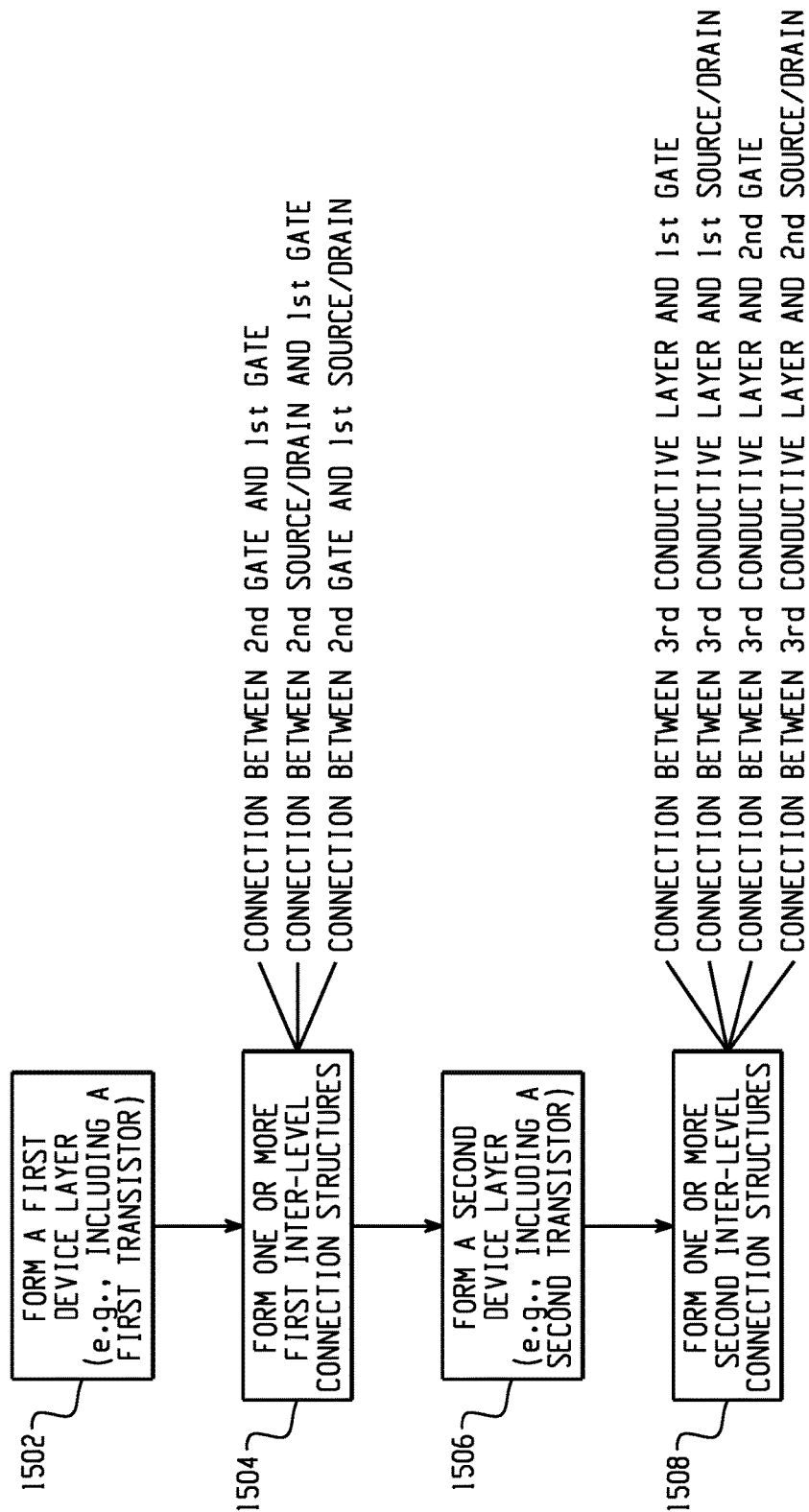

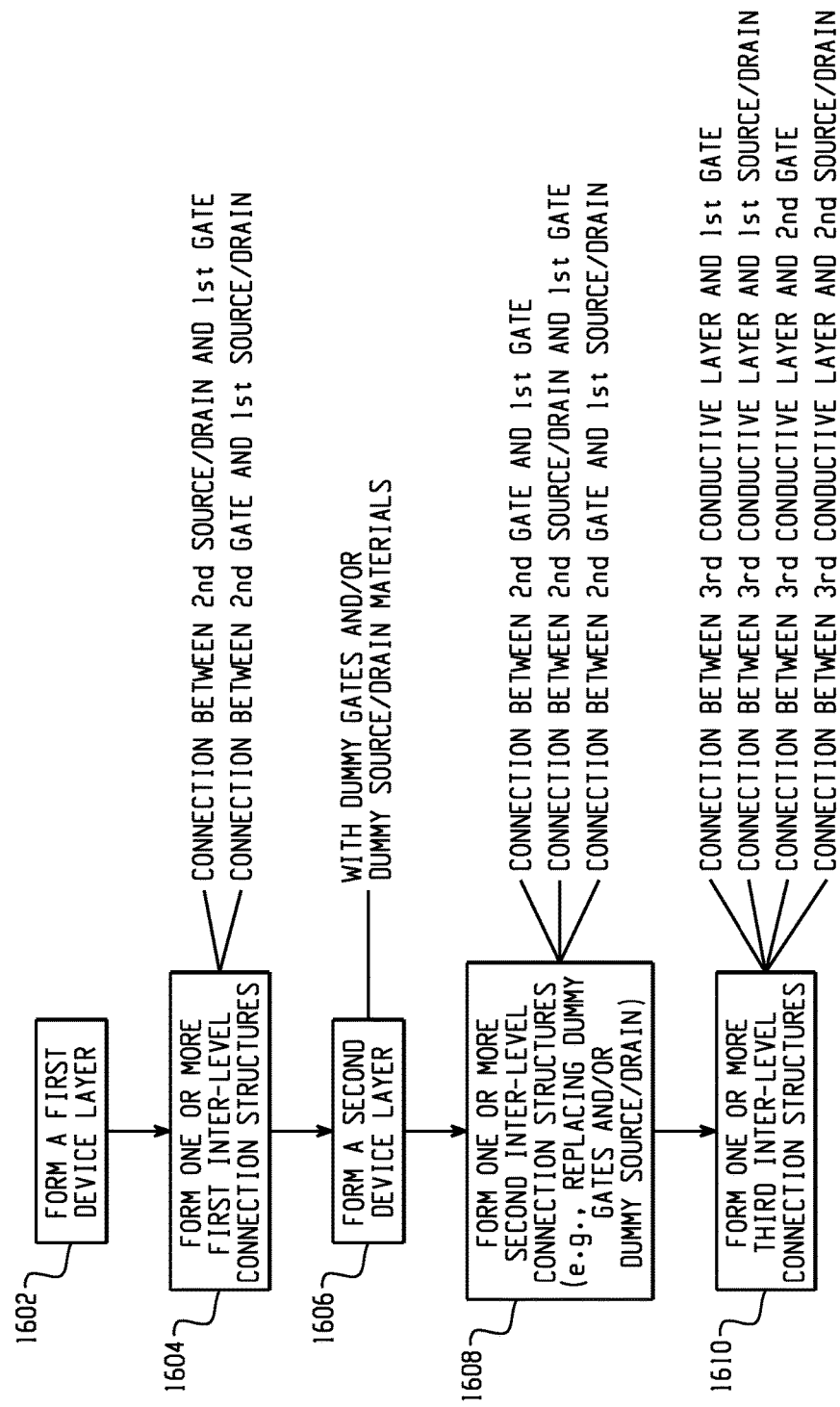

INTER-LEVEL CONNECTION FOR MULTI-LAYER STRUCTURES

FIELD

The technology described in this disclosure relates generally to semiconductor device structures and more particularly to multi-layer structures.

BACKGROUND

Conventional complementary metal-oxide-semiconductor (CMOS) technology is often implemented to fabricate a large number of semiconductor devices, such as metal-oxide-semiconductor field effect transistors (MOSFETs) and bipolar junction transistors (BJTs), at approximately a same level on a single integrated-circuit (IC) chip.

SUMMARY

In accordance with the teachings described herein, systems and methods are provided for fabricating a semiconductor device structure. An example semiconductor device structure includes a first device layer, a second device layer and an inter-level connection structure. The first device layer includes a first conductive layer and a first dielectric layer formed on the first conductive layer, the first device layer being formed on a substrate. The second device layer includes a second conductive layer, the second device layer being formed on the first device layer. The inter-level connection structure includes one or more conductive materials and configured to electrically connect to the first conductive layer and the second conductive layer, the inter-level connection structure penetrating at least part of the first dielectric layer. The first conductive layer is configured to electrically connect to a first electrode structure of a first semiconductor device within the first device layer.

In one embodiment, a method is provided for fabricating a semiconductor device structure. A first device layer is formed on a substrate, the first device layer including a first conductive layer and a first dielectric layer formed on the first conductive layer. An inter-level connection structure including one or more conductive materials is formed, the inter-level connection structure penetrating through at least part of the first dielectric layer and being connected to the first conductive layer. A second device layer is formed on the first device layer, the second device layer including a second conductive layer connected to the inter-level connection structure. The first conductive layer electrically connects to a first electrode structure of a first semiconductor device within the first device layer.

In the advanced semiconductor technology, to integrate different semiconductor devices onto a single IC chip, more and more process steps may need to be implemented individually for each device to fine tune the electrical performance, such as well and source/drain ion implantation, metal gate work-function tuning, and source/drain epitaxy, which often increase the fabrication costs and complexity. In addition, as more devices are incorporated at approximately the same level on a single IC chip, the size of each device and the spacing between the devices (i.e., feature size) continues to decrease. As a result, the lithography process becomes more and more expensive. Furthermore, materials, such as GaAs and Ge, other than silicon may be implemented to make n-channel and p-channel MOSFETs for better performance. However, it is often difficult to integrate and fabricate devices with GaAs channels and Ge channels on the same substrate at a same time.

BRIEF DESCRIPTION OF THE DRAWINGS

FIG. 1 depicts an example diagram of a multi-layer semiconductor device structure.

FIGS. 2A-5 depict example diagrams showing different inter-level connection structures within a multi-layer semiconductor device structure.

FIGS. 6A-9B depict example diagrams showing different inter-level connection structures between two device layers.

FIGS. 10A-13B depict example diagrams showing different connection structures within a same device layer.

FIG. 15 depicts another example flow chart for fabricating a multi-layer semiconductor device structure.

FIG. 16 depicts yet another example flow chart for fabricating a multi-layer semiconductor device structure.

DETAILED DESCRIPTION

Figure 4:
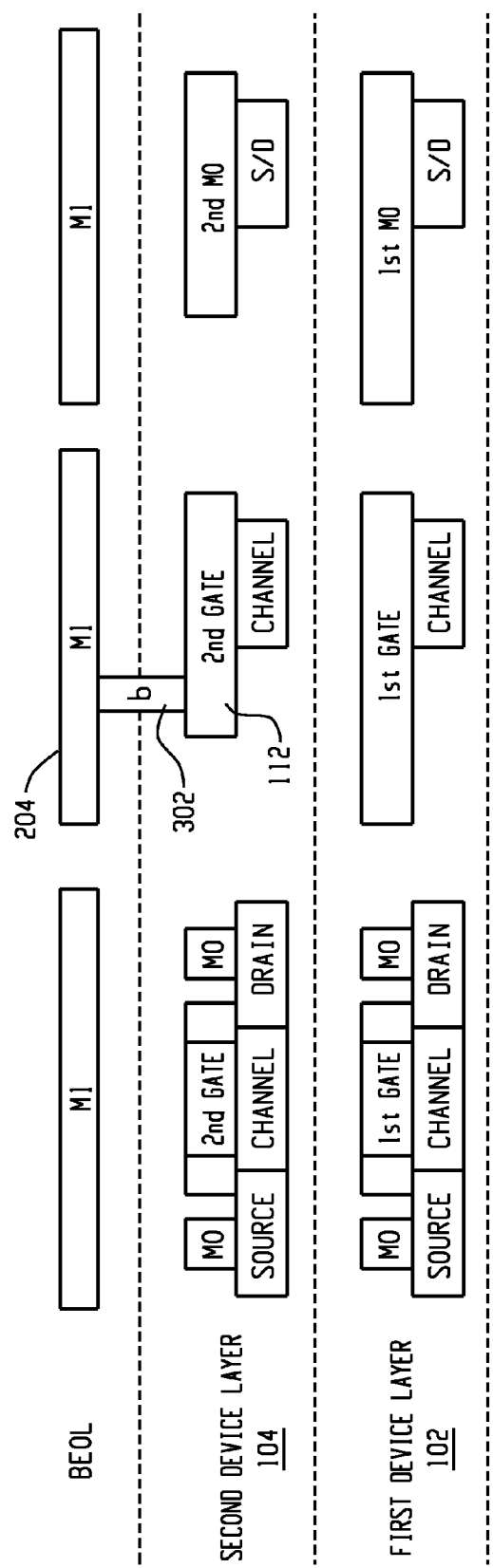

FIG. 1 depicts an example diagram of a multi-layer semiconductor device structure. As shown in FIG. 1, the semiconductor device structure 100 may include multiple device layers (e.g., the layers 102 and 104). Each device layer may be used to fabricate one or more semiconductor devices, such as planar MOSFETs, FinFETs, BJTs, diodes, capacitors, etc. For example, transistors 106 and 108 may be fabricated in the device layers 102 and 104, respectively. The transistor 106 may include a gate electrode structure 118, a source electrode structure 120 and a drain electrode structure 122, and the transistor 108 may include a gate electrode structure 124, a source electrode structure 126 and a drain electrode structure 128. For example, the gate electrode structure 118, the source electrode structure 120 and the drain electrode structure 122 may include polycrystalline silicon or metals (e.g., Al, W, Cu).

Conductive layers 110 (e.g., $1^{st}$ Gate) and 112 (e.g., $2^{nd}$ Gate) may be configured to electrically connect to the gate electrode structures 118 and 124, respectively. In addition, conductive layers 114 (e.g., $1^{st}$ M0) and 116 (e.g., $2^{nd}$ M0) may be configured to electrically connect to the source/drain electrode structures of the transistor 106 and 108 respectively. The device layers 102 and 104 may further include one or more dielectric layers (e.g., $SiO_2$, high-k dielectric materials) extending over substantially at least part of the transistors 110 and 112 respectively. Inter-level connection structures may be constructed to connect different conductive layers or electrode structures, as shown by example diagrams in FIGS. 2-13. For example, the conductive layers 110 and 112 may include polycrystalline silicon or metals (e.g., Al, W, Cu).

FIGS. 2A-5 depict example diagrams showing different inter-level connection structures within a multi-layer semiconductor device structure. As shown in FIG. 2A, an inter-level connection structure 202 may be configured to electrically connect to a conductive layer 204 (e.g., M1) fabricated using one or more back-end-of-line (BEOL) processes and the conductive layer 110 (e.g., $1^{st}$ Gate) within the device layer 102. A margin 206 may be kept between the inter-level connection structure 202 and the conductive layer 112 so that they may not be shorted, as shown in FIG. 2A and FIG. 2B. In addition, a sufficient landing area may be kept on the conductive layer 110 for the inter-level connection structure 202. For example, a margin 208 may be kept between the inter-level connection structure 202 and the conductive layer 112. As an example, the margin 206 may be approximately equal to or smaller than a width of the inter-level connection structure 202. The margin 208 may be approximately equal to or smaller than the margin 206.

In one embodiment, the device layer 102 may be fabricated on a substrate (e.g., through a CMOS process). The device layer 104 may be formed on the device layer 102 (e.g., by deposition, or by wafer bonding). For example, a dielectric layer (e.g., bond buried oxide, high-k dielectric materials) may be used as a base/glue/buffer material for the device layer 104. Before the conductive layer 204 is formed during the BEOL processes, an opening (e.g., a vertical opening) may be formed substantially through the device layer 104 and part of the device layer 102 (e.g., a dielectric layer), and one or more conductive materials (e.g., metals or polycrystalline silicon) may be formed (e.g., through deposition) in the opening to generate the inter-level connection structure 202.

Similarly, as shown in FIG. 3A, an inter-level connection structure 402 may be configured to electrically connect to the conductive layer 204 (e.g., M1) and the conductive layer 114 (e.g., $1^{st}$ M0). A margin 406 may be kept between the inter-level connection structure 402 and the conductive layer 116 (e.g., $2^{nd}$ M0), so that they may not be shorted, as shown in FIG. 3A and FIG. 3B. In addition, a sufficient landing area may be kept on the conductive layer 114 for the inter-level connection structure 402. For example, a margin 408 may be kept between the inter-level connection structure 402 and the conductive layer 114. As an example, the margin 406 may be approximately equal to or smaller than a width of the inter-level connection structure 402. The margin 408 may be approximately equal to or smaller than the margin 406.

Another inter-level connection structure 302 may be constructed to connect the conductive layer 204 (e.g., M1) and the conductive layer 112 (e.g., $2^{nd}$ Gate) together, as shown in FIG. 4. A sufficient landing area may be kept on the conductive layer 112 for the inter-level connection structure 302. In one embodiment, the device layers 102 and 104 may be fabricated consecutively on a substrate (e.g., through a CMOS process). Before the conductive layer 204 is formed during the BEOL processes, an opening (e.g., a vertical opening) may be formed through part of the device layer 104 (e.g., a dielectric layer), and one or more conductive materials (e.g., metals or polycrystalline silicon) may be formed in the opening to generate the inter-level connection structure 302.

Figure 5:
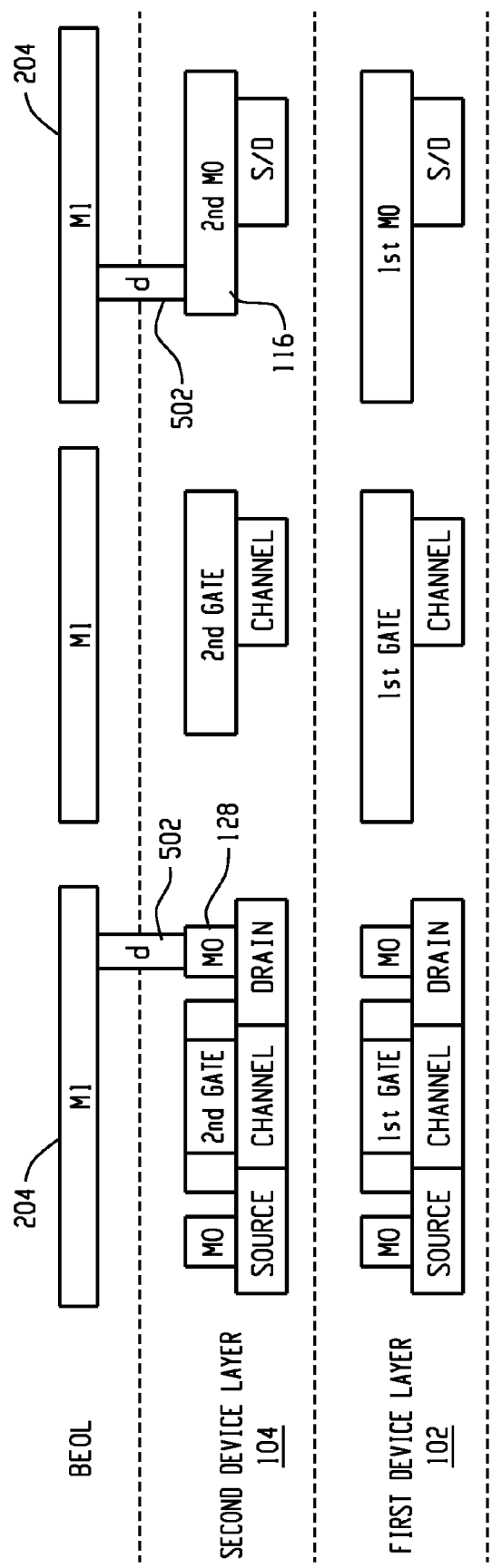

Similarly, an inter-level connection structure 502 may connect the conductive layer 204 (e.g., M1) with the conductive layer 116 (e.g., $2^{nd}$ M0), as shown in FIG. 5. Moreover, another inter-level connection structure 504 may connect the drain electrode structure 128 with the conductive layer 204. In addition, a sufficient landing area may be kept on the conductive layer 116 for the inter-level connection structures 502.

FIGS. 6A-9B depict example diagrams showing different inter-level connection structures between the device layers 102 and 104. As shown in FIG. 6A, an inter-level connection structure 602 may be configured to electrically connect the conductive layer 110 (e.g., $1^{st}$ Gate) and the conductive layer 112 (e.g., $2^{nd}$ Gate) together. Channel layers 604 and 606 may be fabricated (e.g., through oxidation and/or diffusion) substantially under the conductive layers 110 and 112, respectively. For example, one or more thin gate dielectric layers (e.g., $SiO_2$, silicon oxynitride, high-k dielectric materials) may be made to separate the channel layers 604 and 606 from the conductive layers 110 and 112, respectively.

As shown in FIG. 6A and FIG. 6B, a margin 608 may be kept between the inter-level connection structure 602 and the channel layer 604, so that the inter-level connection structure 602 may not land on the conductive layer 110 at an area right above (e.g., vertically) the channel area 604 in order to avoid potential processing variations and reduce the degradation of electrical characteristics. In addition, a margin 610 may be kept between the inter-level connection structure 602 and the channel layer 606, so that they may not be shorted. A sufficient landing area may be kept on the conductive layer 110 for the inter-level connection structure 602. For example, a margin 612 may be kept between the inter-level connection structure 602 and the conductive layer 110. Also, a margin 614 may be kept between the inter-level connection structure 602 and the conductive layer 112. As an example, the margin 610 may be approximately equal to or smaller than a width of the inter-level connection structure 602. The margin 614 may be approximately equal to or smaller than the margin 610. The margin 608 may be approximately equal to or larger than the margin 610. Further, the margin 612 may be approximately twice the margin 614.

In one embodiment, the device layer 102 may be fabricated on a substrate (e.g., through a CMOS process) first, and then part of the device layer 104 (e.g., a dielectric layer, the channel layer 606, and/or a thin gate dielectric) may be formed on the device layer 102. Before the conductive layer 112 is formed, an opening (e.g., a vertical opening) may be formed through part of the device layer 104 and part of the device layer 102 (e.g., a dielectric layer). The inter-level connection structure 602 may then be formed, for example, by depositing one or more conductive materials (e.g., metals or polycrystalline silicon) in the opening. For example, the channel layers 604 and 606 may include silicon carbide, silicon, silicon germanium, germanium, or gallium arsenide.

As shown in FIG. 7A, an inter-level connection structure 702 may be configured to electrically connect to both the conductive layer 114 (e.g., $1^{st}$ M0) and the conductive layer 116 (e.g., $2^{nd}$ M0). Source/drain layers 704 and 706 may be fabricated (e.g., through ion implantation and/or epitaxy) under the conductive layers 114 and 116, respectively. A margin 708 may be kept between the inter-level connection structure 702 and the source/drain layer 704, so that the inter-level connection structure 702 may not land on the conductive layer 114 at an area right above (e.g., vertically) the source/drain layer 704. In addition, as shown in FIG. 7A and FIG. 7B, a margin 710 may be kept between the inter-level connection structure 702 and the source/drain layer 706, so that they will not be shorted. A sufficient landing area may be kept on the conductive layer 114 for the inter-level connection structure 702 (e.g., a margin 712 between the inter-level connection structure 702 and the conductive layer 114), and also a margin 714 may be kept between the inter-level connection structure 702 and the conductive layer 116. As an example, the margin 710 may be approximately equal to or smaller than a width of the inter-level connection structure 702. The margin 714 may be approximately equal to or smaller than the margin 710. The margin 708 may be approximately equal to or larger than the margin 710. Further, the margin 712 may be approximately twice the margin 714.

Figure 8A:
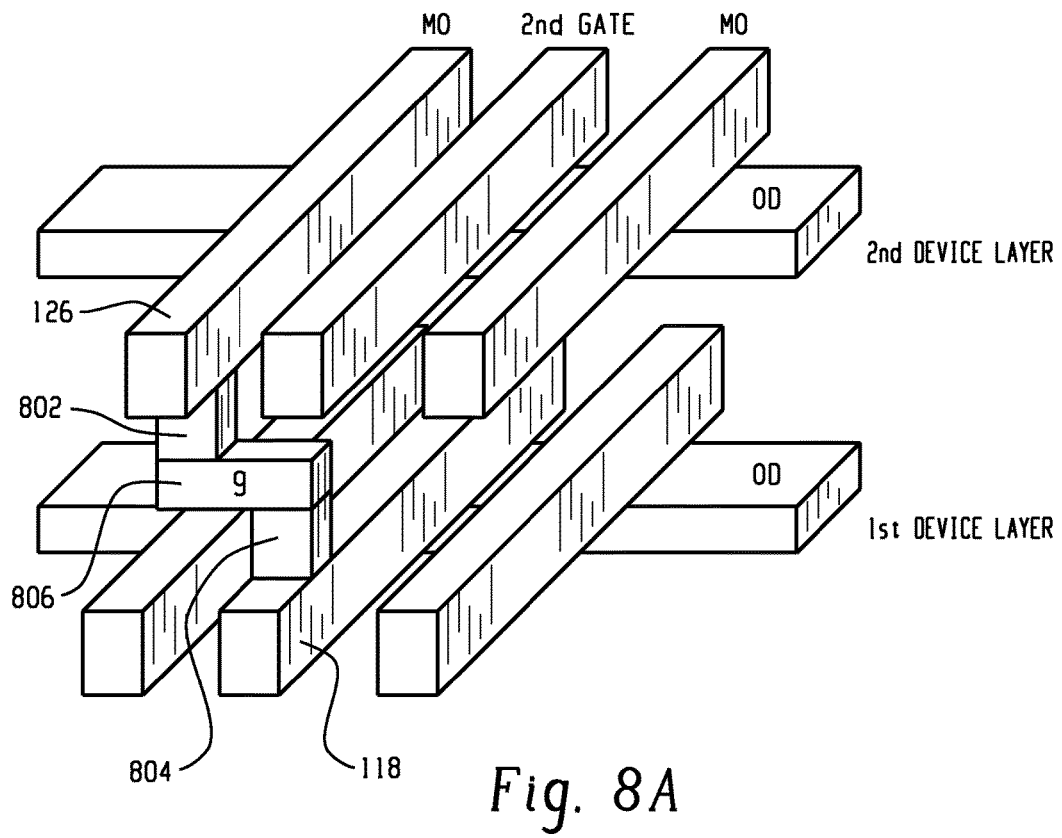
Figure 8B:
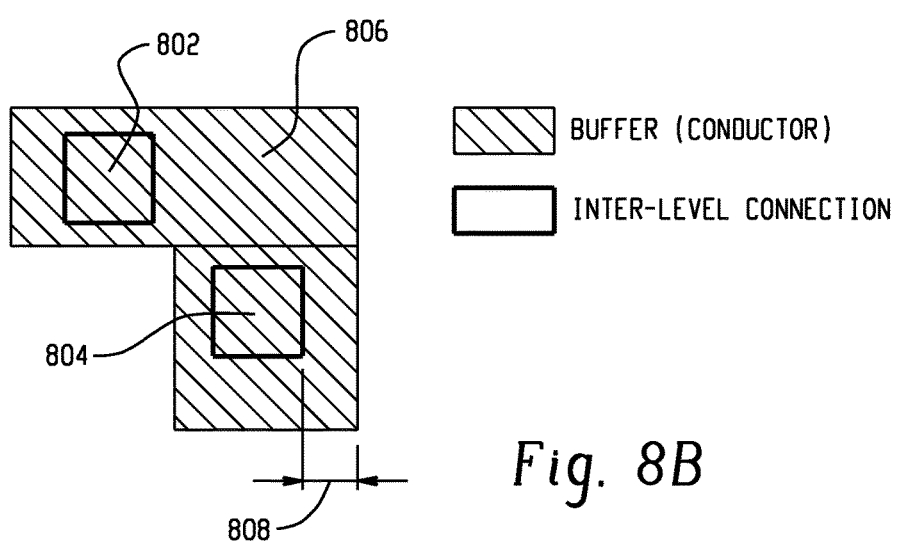

As shown in FIGS. 8A and 8B, an inter-level connection structure includes two vertical via/contacts 802 and 804 and a horizontal buffer 806 that bridges the two vertical via/contacts 802 and 804. The vertical via/contact 802 is in connection with the source electrode structure 126, and the vertical via/contact 804 is in connection with the gate electrode structure 118. A sufficient landing area may be kept on the gate electrode structure 118 for the vertical via/contact 804, as shown in FIG. 8B. For example, a margin 808 may be kept between the vertical via/contact 804 and the gate electrode structure 118.

Figure 9A:
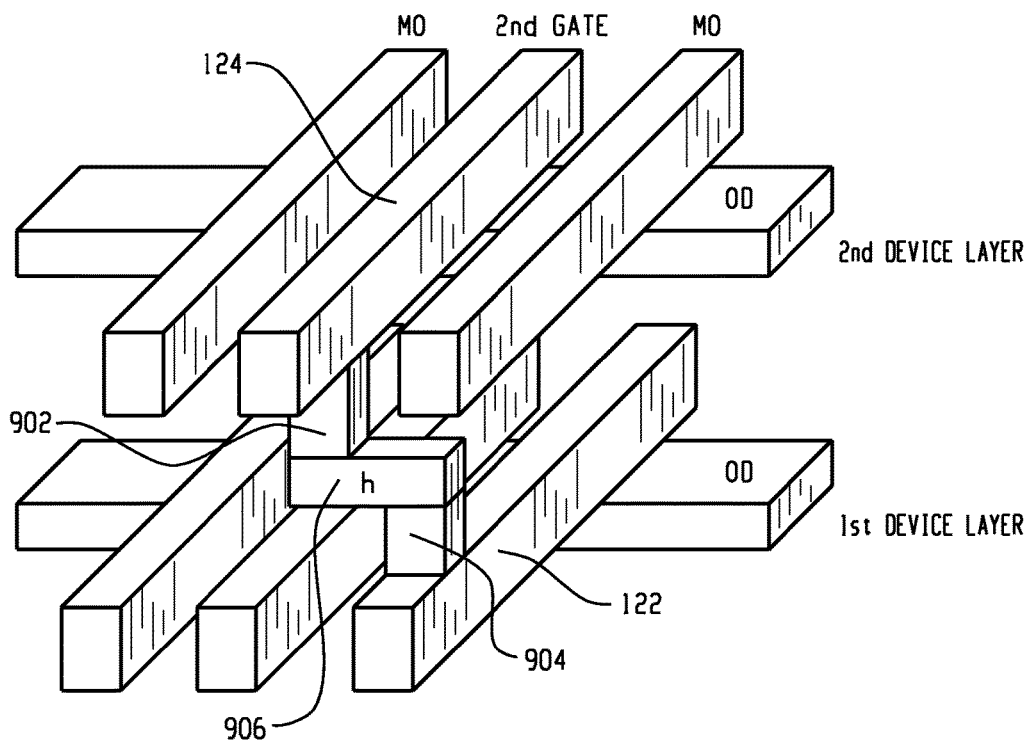
Figure 9B:
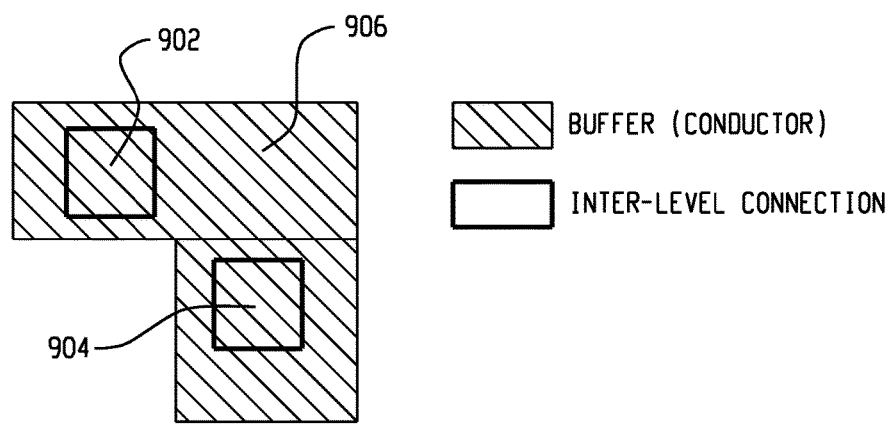

FIGS. 9A and 9B show another inter-level connection structure includes two vertical via/contacts 902 and 904 and a horizontal buffer 906 that bridges the two vertical via/contacts 902 and 904. The vertical via/contact 902 may be in connection with the gate electrode structure 124, and the vertical via/contact 904 may be in connection with the drain electrode structure 122.

FIGS. 10A-13B depict example diagrams showing different connection structures within a same device layer. As shown in FIGS. 10A and 10B, a connection structure 1002 may be constructed to connect the gate electrode structure 118 and the source/drain electrode structure 122 together. Margins 1004 and 1006 may be properly designed so that the connection structure 1002 extends over substantially the gate electrode structure 118 and the drain electrode structure 122. In addition, a margin 1008 may be kept between the connection structure 1002 and the source electrode structure 120 so that they may not be shorted, as shown in FIG. 10B. Similarly, as shown in FIGS. 11A and 11B, a connection structure 1202 may be constructed to connect the gate electrode structure 124 and the drain electrode structure 128 together.

Another connection structure 1102 may be constructed to connect to the gate electrode structure 118 and the drain electrode structure 122, as shown in FIGS. 12A and 12B. The connection structure 1102 may self-align with the gate electrode structure 118 and the drain electrode structure 122, so that a larger overlap margin may be allowed. Similarly, a connection structure 1302 may be constructed to connect to the gate electrode structure 124 and the drain electrode structure 128, as shown in FIGS. 13A and 13B.

Figure 14:
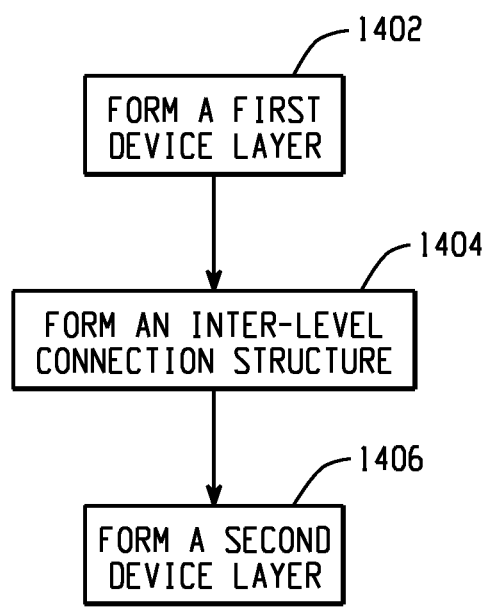
FIG. 14 depicts an example flow chart for fabricating a multi-layer semiconductor device structure.

FIG. 14 depicts an example flow chart for fabricating a multi-layer semiconductor device structure. At 1402, a first device layer may be formed on a substrate. The first device layer includes a first conductive layer and a first dielectric layer formed on the first conductive layer. At 1404, an inter-level connection structure including one or more conductive materials may be formed. The inter-level connection structure may penetrate through at least part of the first dielectric layer and may be connected to the first conductive layer. At 1406, a second device layer may be formed on the first device layer. The second device layer may include a second conductive layer connected to the inter-level connection structure. The first conductive layer may electrically connect to a first electrode structure of a first semiconductor device within the first device layer.

FIG. 15 depicts another example flow chart for fabricating a multi-layer semiconductor device structure. At 1502, a first device layer may be formed on a substrate. The first device layer includes a first conductive layer and a first dielectric layer formed on the first conductive layer. For example, the first device layer may include a first transistor that contains a first gate electrode structure, a first source electrode structure and a first drain electrode structure. At 1504, one or more first inter-level connection structures including one or more conductive materials may be formed. The first inter-level connection structures may penetrate through at least part of the first dielectric layer and may be connected to the first conductive layer. At 1506, a second device layer may be formed on the first device layer. The second device layer may include a second conductive layer connected to the first inter-level connection structures. For example, the second device layer may include a second transistor that contains a second gate electrode structure, a second source electrode structure and a second drain electrode structure. In some embodiments, a third conductive layer (e.g., one or more metal layers) may be formed on the second device layer, e.g., through one or more BEOL processes. At 1508, one or more second inter-level connection structures including one or more conductive materials may be formed.

In one embodiment, the first inter-level connection structures may include a connection (e.g., the structure 602) between the second gate electrode structure and the first gate electrode structure, a connection (e.g., the structures 802, 804 and 806) between the first gate electrode structure and the second source electrode structure or the second drain electrode structure, and/or a connection (e.g., the structures 902, 904 and 906) between the second gate electrode structure and the first source electrode structure or the first drain electrode structure. As an example, one or more first intra-level connection structures are formed to connect different electrode structures within the first device layer. For example, the first intra-level connection structures may include a connection (e.g., the structure 1002) between the first gate electrode structure and the first source electrode structure or the first drain electrode structure.

In another embodiment, the second inter-level connection structures may include a connection (e.g., the structure 202) between the third conductive layer and the first gate electrode structure, a connection (e.g., the structure 402) between the third conductive layer and the first source electrode structure or the first drain electrode structure, a connection (e.g., the structure 302) between the third conductive layer and the second gate electrode structure, and/or a connection (e.g., the structure 502) between the third conductive layer and the second source electrode structure or the second drain electrode structure. As an example, one or more second intra-level connection structures may be formed to connect different electrode structures within the second device layer. For example, the second intra-level connection structures may include a connection (e.g., the structure 1202) between the second gate electrode structure and the second source electrode structure or the second drain electrode structure.

FIG. 16 depicts yet another example flow chart for fabricating a multi-layer semiconductor device structure. At 1602, a first device layer may be formed on a substrate. The first device layer includes a first conductive layer and a first dielectric layer formed on the first conductive layer. For example, the first device layer may include a first transistor that contains a first gate electrode structure, a first source electrode structure and a first drain electrode structure. At 1604, one or more first inter-level connection structures including one or more conductive materials may be formed. The first inter-level connection structures may penetrate through at least part of the first dielectric layer and may be connected to the first conductive layer. At 1606, a second device layer may be formed on the first device layer. The second device layer may include a second conductive layer connected to the first inter-level connection structures. For example, the second device layer may include a second transistor that contains a second gate electrode structure, a second source electrode structure and a second drain electrode structure. As an example, dummy gate structures and/or dummy source/drain materials may be included in the second device layer. At 1608, one or more second inter-level connection structures including one or more conductive materials may be formed, e.g., by replacing the dummy gates and/or dummy source/drain materials. In some embodiments, a third conductive layer (e.g., one or more metal layers) may be formed on the second device layer, e.g., through one or more BEOL processes. At 1610, one or more third inter-level connection structures including one or more conductive materials may be formed.

In one embodiment, the first inter-level connection structures may include a connection (e.g., the structures 802, 804 and 806) between the first gate electrode structure and the second source electrode structure or the second drain electrode structure, and/or a connection (e.g., the structures 902, 904 and 906) between the second gate electrode structure and the first source electrode structure or the first drain electrode structure. As an example, one or more first intra-level connection structures may be formed to connect different electrode structures within the first device layer. For example, the first intra-level connection structures may include a connection (e.g., the structure 1002) between the first gate electrode structure and the first source electrode structure or the first drain electrode structure.

In another embodiment, the second inter-level connection structures may include a connection (e.g., the structure 602) between the second gate electrode structure and the first gate electrode structure, a connection (e.g., the structures 802, 804 and 806) between the first gate electrode structure and the second source electrode structure or the second drain electrode structure, and/or a connection (e.g., the structures 902, 904 and 906) between the second gate electrode structure and the first source electrode structure or the first drain electrode structure.

In yet another embodiment, the third inter-level connection structures may include a connection (e.g., the structure 202) between the third conductive layer and the first gate electrode structure, a connection (e.g., the structure 402) between the third conductive layer and the first source electrode structure or the first drain electrode structure, a connection (e.g., the structure 302) between the third conductive layer and the second gate electrode structure, and/or a connection (e.g., the structure 502) between the third conductive layer and the second source electrode structure or the second drain electrode structure. As an example, one or more second intra-level connection structures may be formed to connect different electrode structures within the second device layer. For example, the second intra-level connection structures may include a connection (e.g., the structure 1202) between the second gate electrode structure and the second source electrode structure or the second drain electrode structure.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. For example, certain transistors are described herein as examples, and the concepts, structures, layouts, materials, or operations may also be applicable to other types of semiconductor devices, such as bipolar junction transistors, diodes, capacitors, etc. As an example, the structures, layouts, materials, operations, voltage levels, or current levels related to "source" and "drain" described herein (including in the claims) may be interchangeable as a result of transistors with "source" and "drain" being symmetrical devices. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The term "under" as used herein (including in the claims) may not indicate that a first layer "under" a second layer is directly under and in immediate contact with the second layer unless such is specifically stated; there may be a third layer or other structure between the first layer and the second layer under the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A semiconductor device structure comprising:
    a substrate;
    a first device layer including a first semiconductor device having a first gate electrode disposed over a first channel region, a first conductive layer, and a first dielectric layer formed on the first conductive layer, the first device layer being formed on the substrate, and the first conductive layer being a laterally extending portion of the first gate electrode beyond the first channel region;
    a second device layer including a second conductive layer, the second device layer being formed over the first device layer; and
    a first inter-level connection structure including one or more conductive materials and connecting the first conductive layer to the second conductive layer,
    wherein:
    the first inter-level connection structure penetrates at least part of the first dielectric layer, and lands on a portion of the first conductive layer other than a portion under which the first channel region exists,
a bottom surface of the first gate electrode laterally extends beyond the first channel region as a bottom surface of the first conductive layer,
the first gate electrode has a same width as the first conductive layer in plan view,
the second conductive layer is a second gate electrode disposed over a second channel region and a laterally extending portion laterally extending from the second gate electrode, and
the first inter-level connection structure connects the first conductive layer to a bottom surface of the laterally extending portion of the second conductive layer.

2. The semiconductor device of claim 1, further comprising:
a third device layer disposed between the first device layer and the second device layer,
wherein the third device layer includes a third conductive layer.

3. The semiconductor device structure of claim 2, wherein:
a first distance between the first inter-level connection structure and a first edge of the third conductive layer is equal to or smaller than a width of the first inter-level connection structure, and
a second distance between the first inter-level connection structure and a second edge of the first conductive layer is greater than the first distance.

4. The semiconductor device structure of claim 3, wherein:
the third device layer include a second gate electrode disposed over a second channel region, and
the third conductive layer is a laterally extending portion of the second gate electrode beyond the second channel region.

5. A semiconductor device structure comprising:
a substrate;
a lower device layer including a first semiconductor device having a first source/drain electrode connected to a first source/drain region, a first conductive layer, and a first dielectric layer formed on the first conductive layer, the lower device layer being formed on the substrate, and the first conductive layer being a laterally extending portion of the first source/drain electrode beyond the first source/rain region;
an upper device layer including a second conductive layer, the upper device layer being formed over the lower device layer; and
a first inter-level connection structure including one or more conductive materials and connecting the first conductive layer to the second conductive layer, wherein:
the first inter-level connection structure penetrates at least part of the first dielectric layer, and lands on a portion of the first conductive layer other than a portion under which the first source/drain region exists,
a bottom surface of the first source/drain electrode is in direct contact with the first source/drain region and laterally extends beyond the first source/drain region as a bottom surface of the first conductive layer, and
the first source/drain electrode has a same width as the first conductive layer in plan view.

6. The semiconductor device structure of claim 5, further comprising:
an intermediate device layer disposed between the lower device layer and the upper device layer,
wherein the intermediate device layer includes a third conductive layer.

7. The semiconductor device structure of claim 6, wherein:
a first distance between the first inter-level connection structure and a first edge of the third conductive layer is equal to or smaller than a width of the first inter-level connection structure, and
a second distance between the first inter-level connection structure and a second edge of the first conductive layer is greater than the first distance.

8. The semiconductor device structure of claim 7, wherein
the intermediate device layer include a second source/drain electrode connected to a second source/drain region, and
the third conductive layer is a laterally extending portion of the second source/drain electrode beyond the second source/drain region.

9. A semiconductor device structure comprising:
a substrate;
a lower device layer including a first semiconductor device having a first electrode disposed in direct contact with a first channel region or a first source/drain region, a first conductive layer, and a first dielectric layer formed on the first conductive layer, the lower device layer being formed on the substrate;
a MOS transistor having a channel different from the first channel region, a gate, a source and a drain and disposed in the lower device layer, the first conductive layer being electrically connected to the gate, or the source or the drain;
an upper device layer including a second conductive layer, the upper device layer being formed over the lower device layer;
a first inter-level connection structure including one or more conductive materials, wherein: and
the first inter-level connection vertically and straightly extends and directly connects the first conductive layer to the second conductive layer, and lands on a portion of the first conductive layer other than a portion under which the first channel region or the first source/drain region exists,
the first conductive layer is a laterally extending portion of the first electrode beyond the first channel region or a laterally extending portion of the first electrode beyond the first source/rain region, and
a bottom surface of the first conductive layer is located at a same level as a bottom surface of the first electrode.

10. The semiconductor device of claim 9, further comprising:
an intermediate device layer disposed between the lower device layer and the upper device layer,
wherein the intermediate device layer includes a third conductive layer.

11. The semiconductor device structure of claim 10, wherein:
a first distance between the first inter-level connection structure and a first edge of the third conductive layer is equal to or smaller than a width of the first inter-level connection structure, and
a second distance between the first inter-level connection structure and a second edge of the first conductive layer is greater than the first distance.

12. The semiconductor device structure of claim 11, wherein the intermediate device layer include a second electrode disposed over a second channel region and a second source/drain region, and the third conductive layer is a laterally extending portion of the second electrode beyond the second channel region or a laterally extending portion of the second electrode beyond the second source/drain region.

13. The semiconductor device of claim 1, wherein the first conductive layer and the first gate electrode are made of a same layer.

14. The semiconductor device of claim 5, wherein the first conductive layer and the first source/drain electrode are made of a same layer.

15. The semiconductor device of claim 5, wherein:

the second conductive layer is a second source/drain electrode disposed on a second source/drain region and a laterally extending portion laterally extending from the second source/drain electrode, and the first inter-level connection structure connects the first conductive layer to a bottom surface of the laterally extending portion of the second source/drain electrode.

16. The semiconductor device of claim 5, wherein the first source/drain electrode has a same thickness as the first conductive layer.

* * * * *